United States Patent [19]

Johnson

[11] Patent Number: 5,360,348

[45] Date of Patent: Nov. 1, 1994

[54] INTEGRATED CIRCUIT DEVICE TEST SOCKET

[75] Inventor: David A. Johnson, St. Louis Park, Minn.

[73] Assignee: JohnsTech International Corporation, Minneapolis, Minn.

[21] Appl. No.: 107,257

[22] Filed: Aug. 16, 1993

[51] Int. Cl.⁵ .............................................. H01R 4/48
[52] U.S. Cl. .................................... 439/72; 439/330; 439/487
[58] Field of Search ................................ 439/71–73, 439/330, 331, 487

[56] References Cited

U.S. PATENT DOCUMENTS

| | | | |
|---|---|---|---|
| 4,758,176 | 7/1988 | Abe et al. | 439/72 X |
| 5,100,332 | 3/1992 | Egawa | 439/331 X |
| 5,266,037 | 11/1993 | Hetzel et al. | 439/72 |

*Primary Examiner*—Eugene F. Desmond
*Attorney, Agent, or Firm*—Nawrocki, Rooney & Sivertson

[57] ABSTRACT

A test socket for testing of semiconductor devices. The socket includes a plurality of electrical contacts mounted within a housing, a cover, and a pressure applicator which serve to prolong test life of the contacts. The pressure applicator is mounted to the cover by use of an elastomeric element which compliantly holds the applicator to the cover. The socket construction, thereby, serves to prevent damage to leads of an integrated circuit device held by the socket.

6 Claims, 4 Drawing Sheets

INTEGRATED CIRCUIT DEVICE TEST SOCKET

TECHNICAL FIELD

The present invention deals broadly with the field of integrated circuits. More narrowly, however, it is related to the field of testing such devices. The specific focus of the invention is a test socket, interfacing with a printed circuit board of a tester, which protects the leads of the device to be tested and contacts at the test socket from damage and extensive wear.

BACKGROUND OF THE INVENTION

Integrated circuit devices have many applications in industry today. In order to provide for proper operation, however, they must be tested to ensure quality within acceptable limits. Such testing and burn-in of integrated circuit devices typically require that the devices be actuated by engagement of leads of a device with corresponding contacts of a test socket, the contacts of the test socket, in turn, being electronically communicated with terminals of a printed circuit board of a test apparatus. It is desirable that such integrated circuit devices can be tested in both manual and automated test equipment. In methods known in the art, "pick and place" handling employs the modification of existing manual test sockets in order to construct dedicated test sockets which interface with a tester Sockets of this type, typically, include a socket housing, the housing including an array of compliant contacts. Further, the socket includes a cover assembly which is, typically, hinged at one edge of the socket housing. The cover is latched, when a device is in the test socket, at an edge of the socket housing opposite that of the hinging.

The integrated circuit devices align within the socket housing by various means. Such means serve to guide the leads of the device into engagement with corresponding contacts within the test socket cavity.

Test/burn-in sockets must be temperature stable; they must be capable of withstanding temperatures between −65° and +165° Celsius. Such extreme temperatures must be able to be withstood for hundreds, if not thousands, of hours of test time, and such endurance must be without any appreciable degradation of operational capability.

Further, it is desirable that a test socket be durable As such, it would be able to withstand the repeated insertion of integrated circuit ,devices for test. Typically, a life cycle of in excess of ten thousand insertions would be expected.

A number of factors must be taken into consideration when considering such a test socket. First, a contact at the test socket housing must include a tip extending upwardly for engagement by a corresponding lead of the device to be tested. The contact is profiled appropriately for interfacing with the device lead. If not appropriately profiled, engagement of the contact tip by the device lead will not effect desired wiping action.

Another factor which must be considered is the compliance of the contact array. Typically, all distal ends of the integrated circuit device leads are not co-planar. The compliance of the test socket housing contacts takes into account this lack of co-planarity. Consequently, as a device is moved so that leads thereof are brought into engagement with corresponding contacts of an array, an efficient amount of force can be applied to each of the device leads to ensure that a good, low contact resistance interface will be achieved.

In the prior art, contacts in such test sockets as being discussed herein, are generally formed with cantilevered arms. Tips of such contacts extend downwardly into the test socket housing. It is within the socket housing that the tips of the contacts are held.

A further consideration to which attention must be given is the manner in which contacts are held and aligned within the housing. It must be ensured that the contacts also serve to be in electronic communication with a printed circuit board of a tester. In the prior art, this is accomplished by employment of an extension of a contact which is formed as a small rectangular or square pin. These square or rectangular pin ends are then inserted into holes formed in the printed circuit board. They are soldered in place.

One proposed solution of the prior art employs a ridge formed in the cover. As the cover is closed, the ridge engages the top of the integrated circuit device received within the socket. The distance the body of the integrated circuit device is moved will depend upon the distance the ridge extends from the cover body. As the IC body is engaged by the ridge, the ridge will serve as a fulcrum, in a sense, and the device will have some tendency to equalize pressure on the contacts and device leads.

This proposed solution, however, has a number of shortcomings. The ridge height is, typically, fixed. Consequently, this solution does not allow for variations in thickness of the device to be tested. As a result, devices having a thicker dimension will result in the deflection of contacts to a greater degree and a resultant higher force being exerted upon the contacts. This force can result in damage to the leads of the devices being tested. The larger deflection of the contacts also causes higher stress on structures employed for mounting the contacts. These factors, in turn, result in a shorter test cycle life.

This proposed solution also causes problems in that the leads are not always maintained to define a plane generally parallel to a plane defined by the contact array. When the cover is closed over the test socket housing, the angle formed between the device and the contact array is not always eliminated. As a result, lead damage and contact damage can occur.

It is to these dictates and problems of the prior art that the present invention is directed. It considers these dictates and problems, and results in a test socket construction which improves over structures and methods employed heretofore.

SUMMARY OF THE INVENTION

The present invention is an improved test socket which functions to electronically interface the leads of an integrated circuit device to be tested, with corresponding terminals on a printed circuit board. It includes a socket housing which mounts a plurality of contacts in a compliant fashion to form an array of an intended shape. Each contact mounted within the housing is engagable with its corresponding terminal of the printed circuit board. The housing defines a cavity therewithin into which the integrated circuit device to be tested is received. The IC device is received with each lead thereof in engagement with a corresponding contact of the socket housing. The socket includes a cover which is closable over the cavity, and a pressure applicator which is carried by the cover. The pressure applicator, when the cover is closed, engages the integrated circuit device which is received within the cavity. The pressure applicator is held to the cover by which it is carried by means of an elastomeric element. AS a result, as the cover is closed over an integrated circuit device placed into the cavity, the pressure applicator conforms to an orientation of the integrated circuit device. In consequence, generally equal force is applied to each of the contacts by a corresponding lead of the integrated circuit device.

In the preferred embodiment, the test socket includes an overtravel stop. Such a stop can serve to limit the distance to which the pressure applicator can approach the compliantly mounted plurality of contacts carried by the socket housing.

In one form of the invention wherein the contacts define a generally rectangular array, the stop can include a plurality of axially extending protrusions, one generally parallel to a line of contacts defining a portion of the array, which engage a floor of the cavity defined within the housing. The actuation force between the leads of the integrated circuit device inserted into the cavity and the contacts of the array will, thereby, be controlled. Sufficient force will, as a result, be provided to ensure low contact resistance while still limiting the maximum force so that damage to the leads of the device will be prevented.

In one embodiment, the elastomeric element for holding the pressure applicator to the cover can take the form of a grommet. A tubular main body portion of the grommet can extend through aligned apertures formed in the cover and the pressure applicator, and flange portions at opposite ends of the tubular portion can be spaced at a distance so as to function to hold the pressure applicator to the cover.

In another embodiment of the invention, a main body portion of the pressure applicator can be axially coextensive with protrusions extending axially from the cover. Edge portions of radially outwardly facing surfaces of the pressure actuator and the protrusions can alternate circumferentially, and the surfaces can be provided with radially outwardly facing slots. In this embodiment, the elastomeric element can take the form of a continuous resilient ring which extends around the axially coextensive pressure applicator portion and the protrusions extending axially from the cover and be received in the slot.

In this embodiment, again, axially aligned, registered apertures can be formed in the cover and pressure applicator. A heat conductive tube can be made to extend through these registered apertures to effect heat transfer into the cavity in which the integrated circuit to be tested is received. The tubular member can, if desired, be provided with external fins to maximize heat transfer.

The present invention is thus an improved test socket which functions to electronically interface the leads of an integrated circuit device to be tested with corresponding terminals on a printed circuit board. More specific features and advantages obtained in view of those features will become apparent with reference to the DETAILED DESCRIPTION OF THE INVENTION, appended claims and accompanying drawing figures.

DETAILED DESCRIPTION OF THE INVENTION

Figure 1:
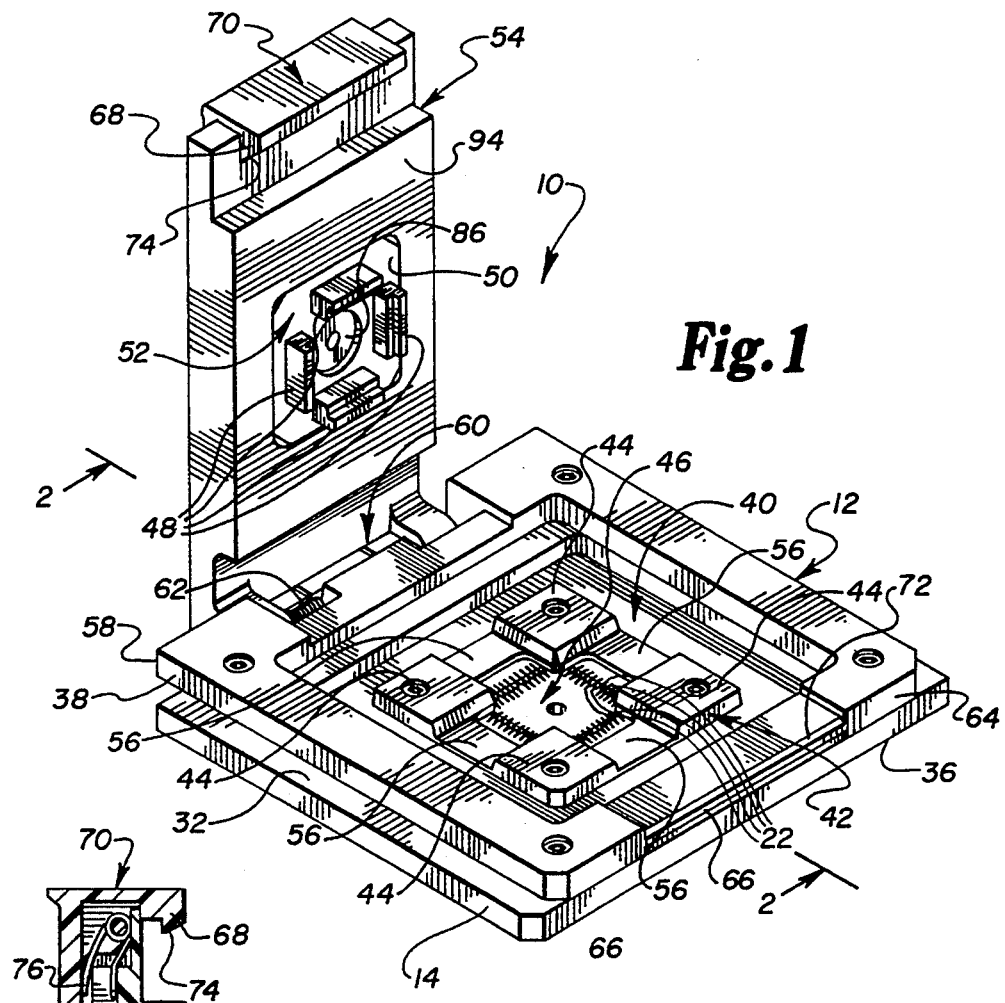
FIG. 1 is a perspective view of the subject invention with a cover pivoted, along one edge of a socket housing, upwardly and away from a cavity formed in the socket housing.
Figure 4:
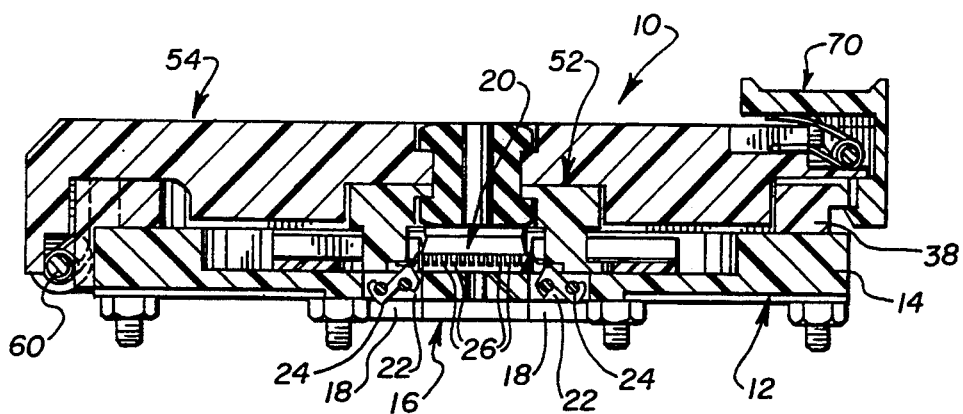
FIG. 4 is a side sectional view of the structure of FIG. 3 taken generally along line 4—4 of FIG. 3.

Referring now to the drawing figures wherein like reference numerals denote like elements throughout the several views, FIG. 1 illustrates an integrated circuit test socket 10 in accordance with the present invention. The socket 10 includes a housing 12 which is illustrated as having a laminar structure. A lower layer comprises a base plate 14 which is mounted, during operation, closely proximate a printed circuit board 16, a portion of which is illustrated in FIG. 4. The circuit board 16, has traced on an upper surface thereof, terminals 18 which electronically communicate with a test apparatus (not shown) for testing various parameters of an integrated circuit 20 to be received within the test socket 10.

The base plate 14, as best seen in FIG. 1, has a plurality of slots 22, generally defining a square configuration, formed therethrough. The slots 22, in turn, receive a plurality of contacts 24, one in each slot 22, for a purpose as will be defined hereinafter. The contacts 24, thereby, define an array for interfacing and interconnecting the leads 26 of an integrated circuit device 20 to be tested and the corresponding terminals 18 on the printed circuit board 16. The particular array illustrated in the figures would be appropriate for employment in testing a quad flat pack (QFP) or plastic leadless chip carrier (PLCC) integrated circuit device. It will be understood, however, that the invention is intended for various types of integrated circuit devices and corresponding varied contact arrays.

The figures illustrate an array of contacts 24 mounted to the housing 12 by means of a pair of elastomeric elements 28, one received in a trough 30 formed in a first side 32 of the base plate 14 and extending generally transverse to axes of the slots 22, and the other received in a trough 34 formed in an opposite side 36 of the base plate 14. The specific contact operation is disclosed in Applicant's issued U.S. Pat. No. 5,027,584, which issued on May 4, 1993.

The housing 12 further includes a second layer 38 which is generally conformant, in external shape, to the base plate 14, although it can have somewhat smaller dimensions. It will be noted that the interior of the second layer 38 is hollow in order to define a cavity 40 within the housing 12.

The location of the contact array is shown as being bounded by an insert 42 secured within the cavity 40.

The insert 42 is provided with four alignment lands 44, one land 44 at a corner of the test site 46 defined by the contact array. These alignment lands 44 cooperate with protrusions 48 extending down from an inner surface 50 of a pressure applicator 52 carried by a cover 54 as will be discussed hereinafter. The spaces 56 between the lands 44 serve to receive corresponding protrusions 48 extending from the pressure applicator 52. An integrated circuit 20 to be tested will, thereby, be appropriately positioned at the test site 46.

It will be noted that one edge 58 of the housing 12 is provided with a hinge 60. The hinge 60 is pivotally mounted for movement between open and closed positions. In one embodiment of the invention, a torsion spring 62 is employed to bias the cover 54 to its open position.

It will also be noted that the opposite edge 64 of the housing 12 is provided with a slit 66 to receive a lip 68 of a catch 70 provided at an edge of the cover 54 opposite the edge by which it is hinged to the housing 12. It is intended, typically, that the catch 70 be biased to a closed position so that, when the cover 54 is pivoted to a closed position, the catch 70 will automatically latch the cover 54 closed.

To this end, an upper surface 72 of the housing second layer 38 at an outer edge opposite the hinge 60, can be beveled as at 72. This bevel or chamfer 72 can cooperate with a cooperating bevel 74 formed on the lip 68 of the catch mechanism 70 so that the catch 70 will automatically open as the cover 54 is closed. Once the cover 54 becomes fully closed, the catch mechanism 70 will hold the cover 54 in a closed disposition.

Figure 2:
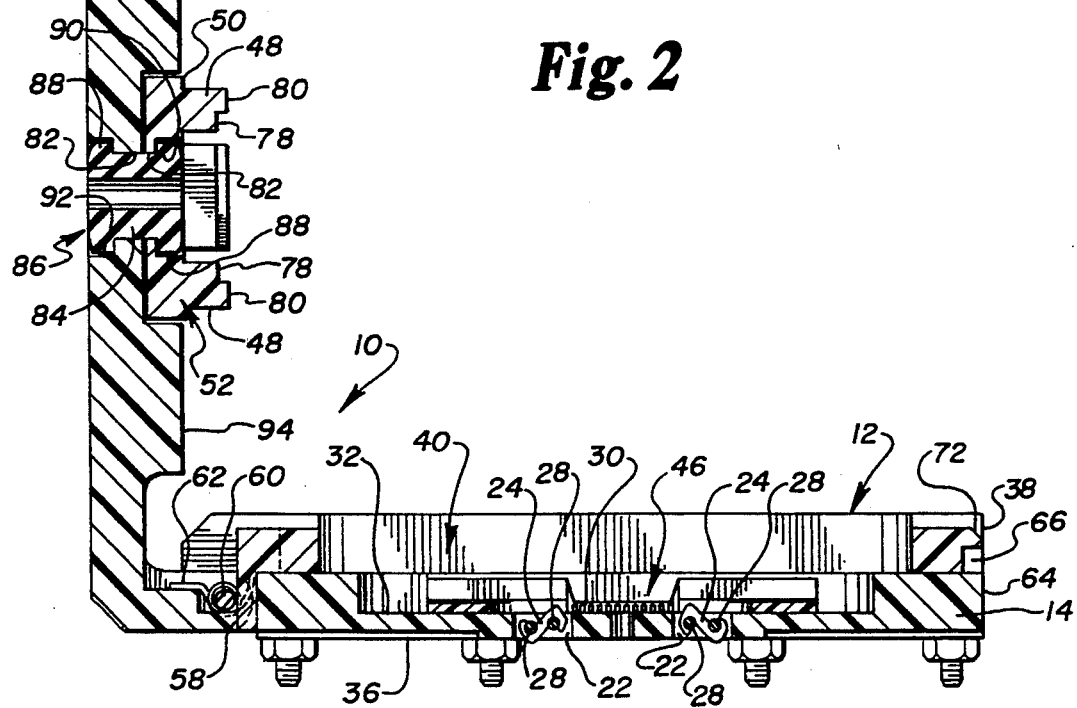
FIG. 2 is a side sectional view thereof taken generally along line 2—2 of FIG. 1.
Figure 3:
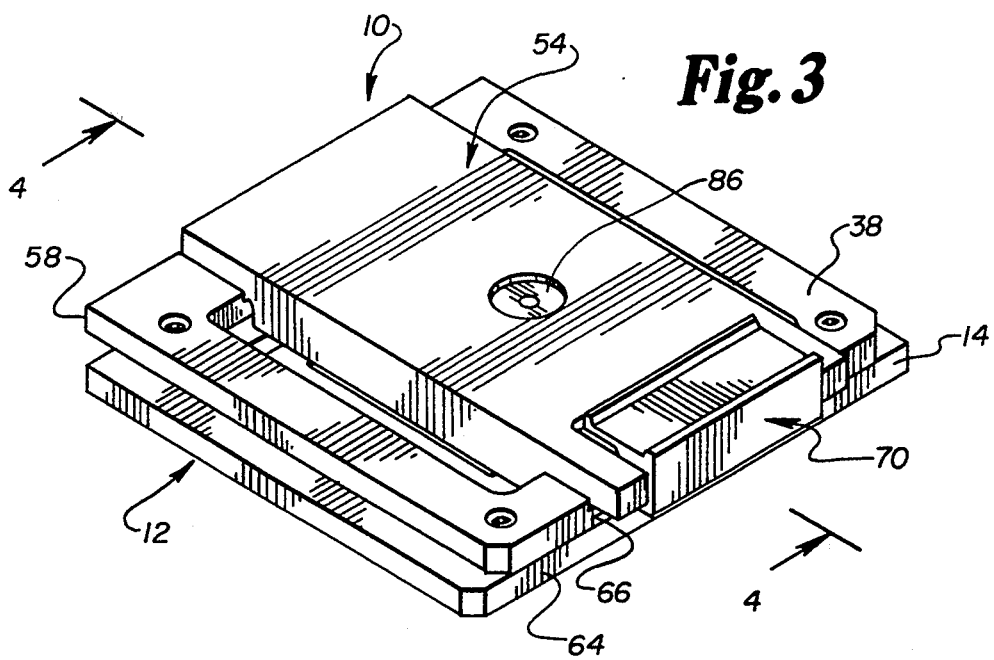
FIG. 3 is a perspective view similar to FIG. 1, but with the cover closed over an integrated circuit device.
Figure 5:
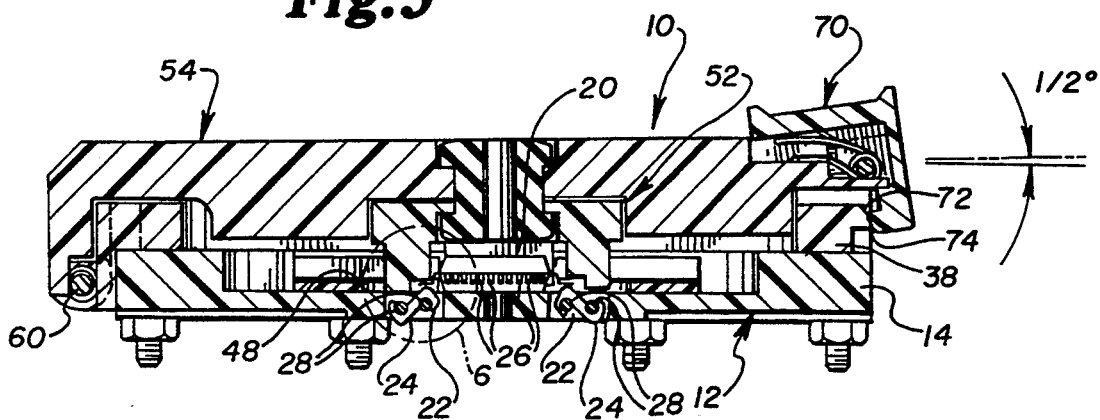
FIG. 5 is a view similar to FIG. 4, but with a latching mechanism in a release position.

FIGS. 2 and 5 best illustrate the biasing of the catch mechanism 70. As seen in those figures, one means for biasing the catch to the locked position is a torsion spring 76 for urging the catch 70 about an axis of rotation.

The figures also illustrate the pressure applicator 52 which is carried by the cover 54. The pressure applicator 52 is carried at a position on the cover 54 so that, when the cover 54 is closed, it will register with the test site 46 defined by the array of contacts 24 mounted within the base plate 14 of the housing 12. Similarly, as the cover 54 is closed, a series of protrusions 48 (four are illustrated in FIG. 1) will be received within corresponding spaces 56 between the alignment lands 44. Each protrusion 48 is stepped in a manner facing internally within a square area defined by the protrusions 48. An upper step 78 of each protrusion 48 serves as a "lead backer". That is, a QFP integrated circuit, for example, can be fitted between the four protrusions 48 with the leads 26 along one edge of the IC body engaged against the upper step 78 of a corresponding protrusion 48. It will be understood, of course, that the protrusions 48 will be located on the pressure applicator 52 at positions appropriate for the particular integrated circuit being tested.

A lower step 80 of each protrusion 48 serves as a stop. The lower step 80, or distal end of the protrusion 48, as the cover 54 is closed, engages a surface of the insert 42 between two adjacent alignment lands 44. Pressure exerted upon the leads 26 of the integrated circuit 20 by the upper, "lead backer" steps 78 will thereby be limited. The pressure exerted upon the contacts 24 of the array mounted in the base plate 14 of the socket housing 12 will be commensurately limited. As a result, life of the contacts 24 and the test socket 10 will be increased.

Figure 6:
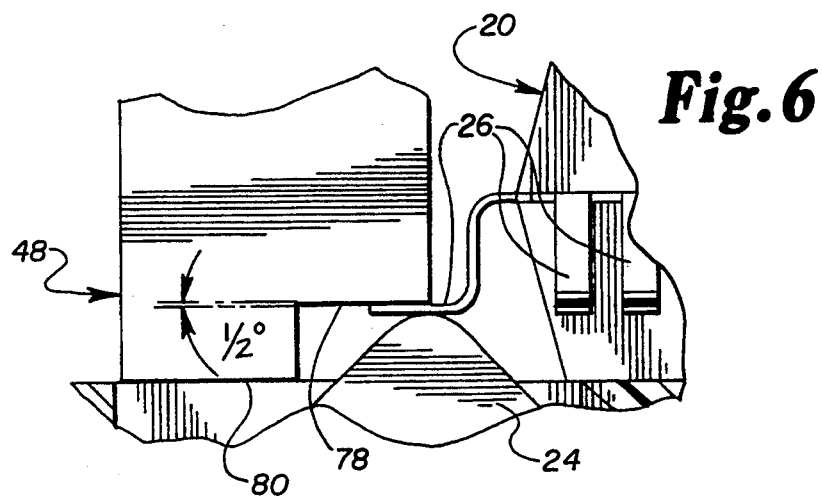
FIG. 6 is an enlarged fragmentary view thereof.

FIG. 6 illustrates, in detail, the functioning of the "lead backer" step 78 and the stop 80. As previously indicated, the contacts 24 are compliantly mounted to a pair of elastomers 28. Consequently, they will be urged downwardly when they are engaged by the "lead backed" integrated circuit leads 26. If it were not for the stop portions 80 of the protrusions 48, however, undue stress could be placed upon both the contacts 24 and the elastomers 28 by which they are supported. It will also be understood that the leads 26 of the integrated circuit device 20 are also, to some degree, resilient. Consequently, as the body of the IC 20 were brought into engagement with the floor of the test site 46, the leads 26 would become tensioned, to a degree, as the lead backer moved farther downward. Such tensioning, in a safe measure, is appropriate and acceptable. The stop's further function, however, is to ensure that the leads 26 do not become tensioned beyond their point of resiliency.

FIGS. 1, 2, 4, and 5 show the manner in which, in a first embodiment, the pressure applicator 52 is securely carried by the cover 54. Aligned apertures 82 are provided in the cover 54 and the pressure applicator 52. A tubular portion 84 of a rubber grommet 86 is shown as being passed through these aligned apertures 82, and the grommet 86 has, at either end, an expanded flange portion 88. The lower of these expanded flange portions 88 is received within an expanded annular recess 90 on the underside of the pressure applicator 52, and the upper expanded flange portion is received within an expanded annular recess 92 on the upper side of the cover 54.

It will be understood that the dimensions of the grommet 86 are such as to hold the pressure applicator 52 relatively secure to the cover 54. As seen in FIG. 5, however, because of the fact that the cover 54 does not approach the housing 12 in a fashion wherein a plane defined by the cover 54 is maintained generally parallel to a plane defined by the housing 12, the "lead backer" upper step 78 of the protrusion 48 most closely proximate the hinge 60 will first engage its corresponding line of integrated circuit device leads 26. It is desirably, however, that substantially uniform pressure be applied to all leads 26 of the device 20 and corresponding contacts 24 mounted to the housing 12. Because of the compliancy of the grommet 86, however, the pressure applicator 52 will tend to assume the definition of a plane generally parallel to that defined by the housing 12, and the "lead backer" upper step 78 of the protrusion 48 opposite that most closely proximate the hinge 60 will also engage the leads 26 of the integrated circuit 20 on its side of the IC body. Continued downward pivoting of the cover 54 will occur until the stop portions 80 of the protrusions 48 engage the floor of the test site 46. It will be understood, of course, that the lengths of the stops 80 will be made in an appropriate fashion so that damage will not be occasioned upon the leads 26, the contacts 24 or the elastomers 28.

Figure 7:
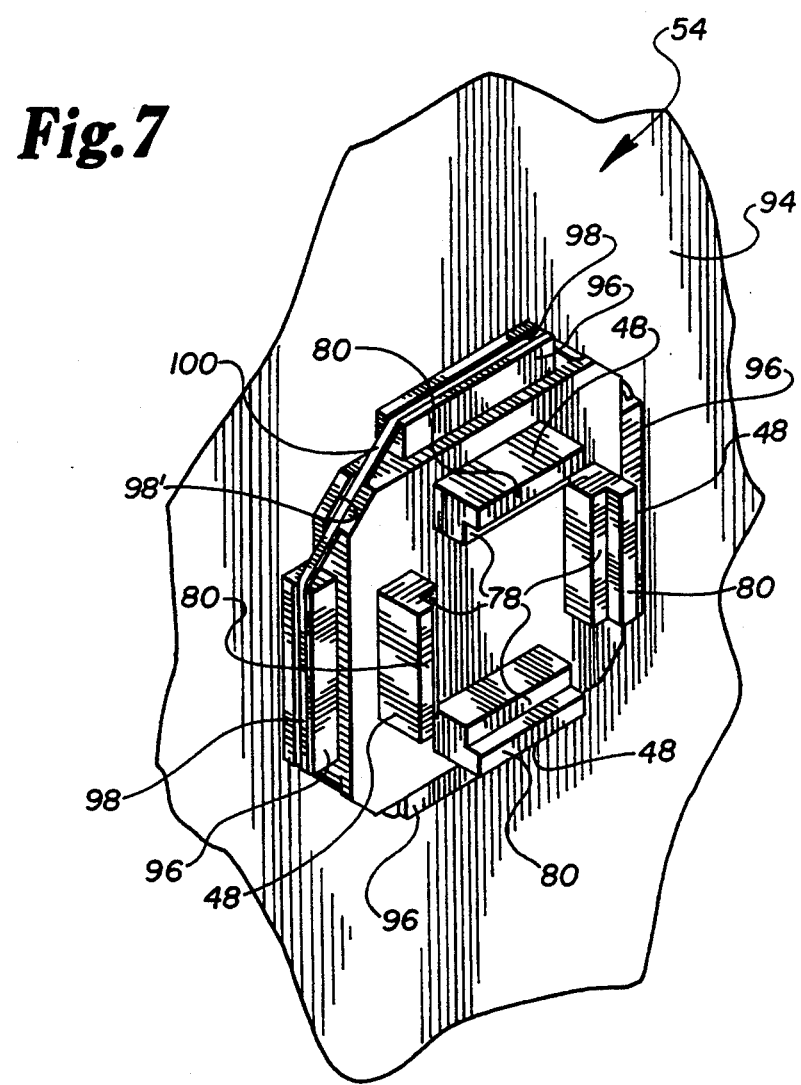
FIG. 7 is an enlarged fragmentary perspective view of an alternative embodiment of a pressure applicator and the elastomeric element for holding the applicator to the cover.

Referring now to FIG. 7, an alternative embodiment of the invention employing a different elastomeric element for holding the pressure applicator 52 to the cover 54 is shown. In that embodiment, the construction of the pressure applicator 52 is similar to that of the first embodiment. In the embodiment of FIG. 7, however, an upper surface of the applicator 52 is flush against a lower surface 94 of the cover 54. A series of protrusions 96, however, are placed on the underside 94 of the cover 54 at locations so as to generally frame the pressure applicator 52 therewithin. Radially outwardly facing surfaces of these framing members 96 are provided with slots 98, and corners of the pressure applicator 52 are provided with similar slots 98'. When the applicator 52 is placed within a position surrounded by the protrusions 96, the slots 98, 98' are axially coextensive. As a result, a continuous elastomeric element 100 can be stretched and positioned so as to be received within the various slots 98, 98' formed in the pressure applicator 52 and the protrusions 96 extending from the underside 94 of the cover 54. The pressure applicator 52 is, thereby, held in place on the underside 94 of the cover 54.

Figure 8:
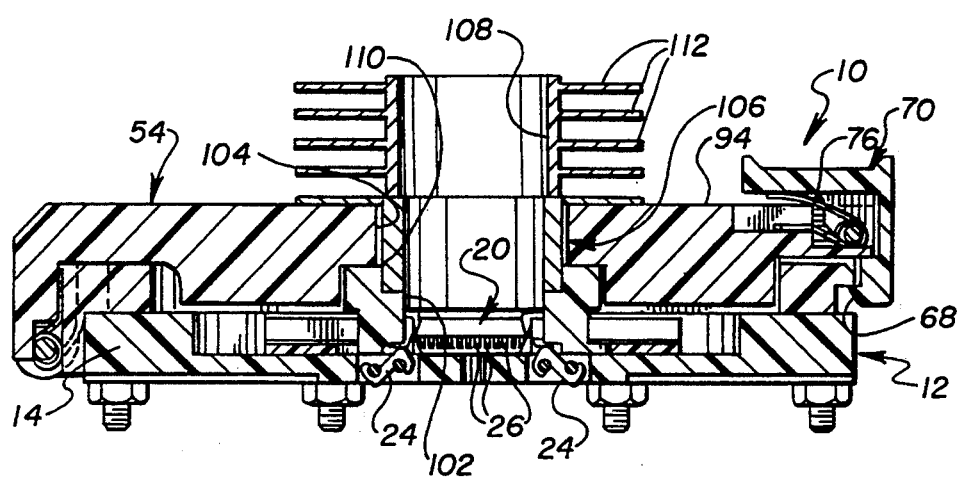
FIG. 8 is a side sectional view of an embodiment of the invention employing a thermally conductive tube extending through aligned apertures in the cover and pressure applicator elements.

FIG. 8 illustrates the elastomeric element of FIG. 7 for holding the pressure applicator 52 in place. In FIG. 8, however, a heat conductive apparatus is shown for conducting heat to, or away from, the test site 46. FIG. 8 illustrates a pressure applicator 52 which is made of a heat-conductive material. It has been found that aluminum is appropriate for this purpose.

In this embodiment, apertures 102, 104 are provided in both the pressure applicator 52 and the cover 54. The apertures 102, 104 are formed at locations so that, when the pressure applicator 52 is held in place against the cover 54, they will be aligned.

FIG. 8 also illustrates a thermal conductivity member 106. The conductivity member 106 includes a tubular portion 108 which passes through the aligned apertures 102, 104 and is fitted into an annular recess 110 formed in an upper surface of the pressure applicator 52 immediately surrounding the aperture 102. The thermal conductivity member 106, it will be understood, is also formed from a heat-conductive material, such as aluminum. Consequently, heat at a source above the cover 54 can be transmitted along the length of the member 106 to the integrated circuit device 20 while it is being tested.

FIG. 8 also illustrates a plurality of annular fins 112 formed around the tubular portion 108 of the thermal conductivity member 106. Air flow above the socket cover 54 can effect heat transfer to the fins 112, and, in turn, to the tubular portion 108 for further transmission to the test site 46. It will also be understood that air flow can pass through the tubular portion 108 of the thermal conductivity member 106 and through the registered apertures 102, 104 in the cover 54 and pressure applicator 52 directly to the test site 46.

Numerous characteristics and advantages of the invention covered by this document have been set forth in the foregoing description. It will be understood, however, that this disclosure is, in many respects, only illustrative. Changes may be made in details, particularly in matters of shape, size, and arrangement of parts without exceeding the scope of the invention. The invention's scope is, of course, defined in the language in which the appended claims are expressed.

What is claimed:

1. A test socket for electronically interfacing leads of an integrated circuit device to be tested with corresponding terminals on a printed circuit board, comprising:
    (a) a socket housing compliantly mounting a plurality of contacts, each contact engagable with a corresponding terminal of the printed circuit board, said housing defining a cavity within which the integrated circuit device to be tested is received with each lead of the device in engagement with a corresponding contact;
    (b) a cover closable over said cavity;
    (c) a pressure applicator carried by said cover and engagable with an integrated circuit device, received within said cavity, when said cover is closed over said cavity; and
    (d) an elastomeric element compliantly holding said pressure applicator to said cover so that, as said cover is closed over an integrated circuit device received within said cavity, said pressure applicator conforms to an orientation of the integrated circuit device, as it engages the integrated circuit device, in order to effect generally equal force application to each of said contacts by a corresponding integrated circuit device lead.

2. A test socket in accordance with claim 1 further comprising a stop for limiting the distance to which said pressure applicator can approach said compliantly mounted plurality of contacts.

3. A test socket in accordance with claim 2 wherein said contacts define a generally rectangular array, and wherein said stop includes a projection engagable with a floor of said cavity.

4. A test socket in accordance with claim 1 wherein said cover and said pressure applicator have registered apertures formed therein, and wherein said elastomeric element comprises a resilient grommet passing through said registered apertures.

5. A test socket in accordance with claim 1 wherein said cover is provided with a plurality of axially extending protrusions which are axially coextensive with said pressure applicator, said axially extending protrusions and a radially outwardly facing edge of said pressure applicator having radially outwardly facing, circumferentially coextensive slots formed therewithin, said elastomeric element comprising a continuous resilient ring received within said slots.

6. A test socket in accordance with claim 5 wherein said cover and said pressure applicator have axially aligned apertures formed therewithin, said test socket further comprising a heat conductive tube extending through said axially aligned apertures.

* * * * *